(12) United States Patent
Noda et al.

(10) Patent No.: US 8,866,151 B2
(45) Date of Patent: Oct. 21, 2014

(54) SEMICONDUCTOR DEVICE

(75) Inventors: Takao Noda, Himeji (JP); Ryoichi Ohara, Himeji (JP); Kenya Sano, Himeji (JP); Toru Sugiyama, Musashino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 13/425,246

(22) Filed: Mar. 20, 2012

(65) Prior Publication Data

US 2012/0241762 A1  Sep. 27, 2012

(30) Foreign Application Priority Data

Mar. 23, 2011 (JP) .................. 2011-065037

(51) Int. Cl.
| | | |
|---|---|---|
| H01L 29/161 | (2006.01) | |
| H01L 29/47 | (2006.01) | |
| H01L 29/872 | (2006.01) | |
| H01L 29/66 | (2006.01) | |
| H01L 29/16 | (2006.01) | |
| H01L 29/20 | (2006.01) | |
| H01L 29/43 | (2006.01) | |
| H01L 29/06 | (2006.01) | |
| H01L 21/04 | (2006.01) | |

(52) U.S. Cl.
CPC ......... *H01L 29/1608* (2013.01); *H01L 29/2003* (2013.01); *H01L 29/43* (2013.01); *H01L 29/872* (2013.01); *H01L 29/6606* (2013.01); *H01L 29/0619* (2013.01); *H01L 21/0465* (2013.01); *H01L 29/0692* (2013.01)
USPC .............. 257/77; 257/441; 257/472

(58) Field of Classification Search
CPC ............................ H01L 29/872; H01L 27/095

USPC ............................. 257/77, 471, 472
See application file for complete search history.

(56) References Cited

U.S. PATENT DOCUMENTS

| 6,861,723 B2 * | 3/2005 | Willmeroth .................. 257/471 |
| 2002/0125482 A1 * | 9/2002 | Friedrichs et al. .............. 257/73 |
| 2008/0277668 A1 | 11/2008 | Okuno et al. | |

FOREIGN PATENT DOCUMENTS

| JP | 2000252478 A | 9/2000 |
| JP | 2007243061 A | 9/2007 |
| JP | 2008042198 A | 2/2008 |
| JP | 2008282972 A | 11/2008 |
| JP | 2010-087483 | 4/2010 |

OTHER PUBLICATIONS

Japanese Office Action dated Jul. 30, 2013, filed in Japanese counterpart Application No. 2011-065037, 7 pages (with translation).
Chinese Office Action dated Apr. 3, 2014, filed in Chinese counterpart Application No. 201210080160.2, 17 pages (with translation).

* cited by examiner

*Primary Examiner* — Robert Carpenter
(74) *Attorney, Agent, or Firm* — Patterson & Sheridan, LLP

(57) ABSTRACT

According to one embodiment, a semiconductor device includes a semiconductor layer of a first conductivity type, a first region of a second conductivity type selectively provided in a first major surface of the semiconductor layer, a second region of the second conductivity type selectively provided in the first major surface and connected to the first region, a first electrode provided in contact with the semiconductor layer and the first region, a second electrode provided in contact with the second region, and a third electrode electrically connected to a second major surface of the semiconductor layer opposite to the first major surface.

12 Claims, 4 Drawing Sheets

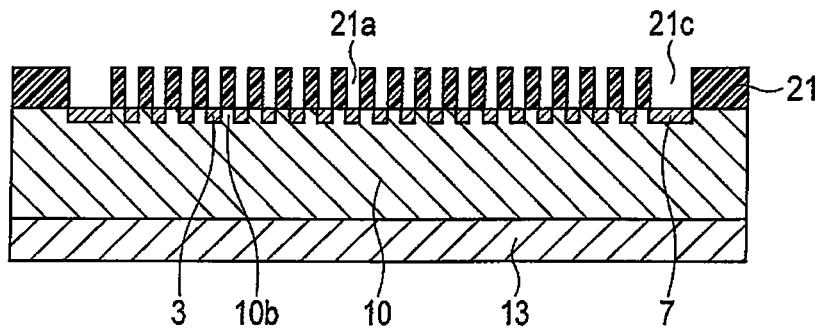
F I G. 2
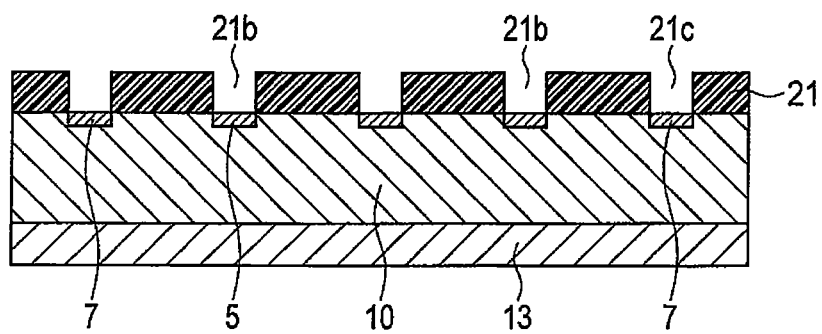
F I G. 3
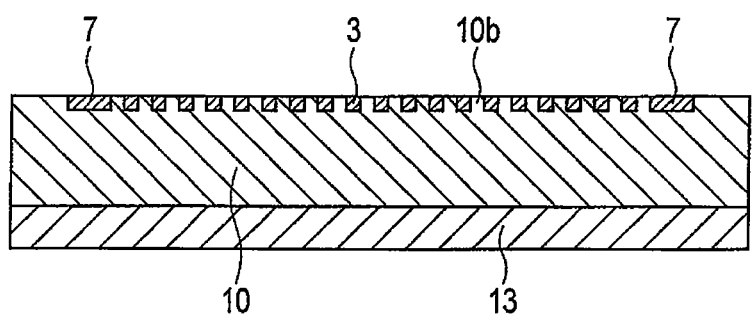
F I G. 4
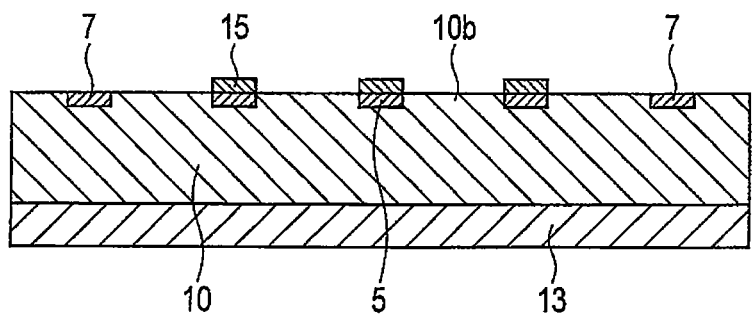
F I G. 5

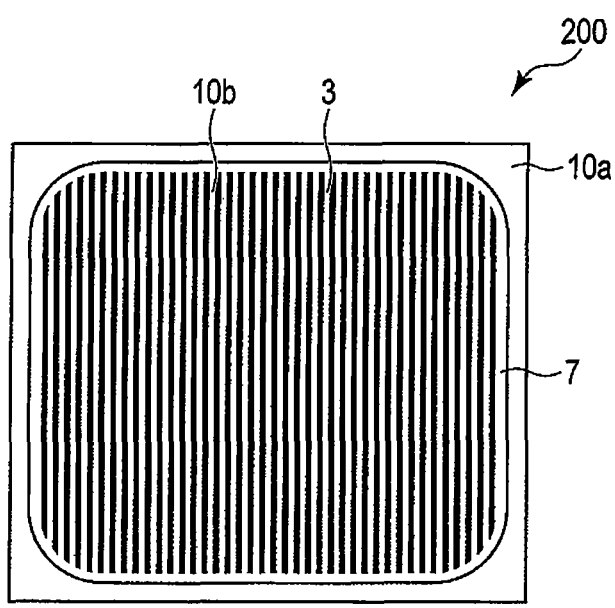
F I G. 9

SEMICONDUCTOR DEVICE

CROSS-REFERENCE TO RELATED APPLICATIONS

This application is based upon and claims the benefit of priority from prior Japanese Patent Application No. 2011-065037, filed Mar. 23, 2011, the entire contents of which are incorporated herein by reference.

FIELD

Embodiments described herein relate generally to a semiconductor device.

BACKGROUND

A wide-gap semiconductor such as silicon carbide (SiC) or a nitride semiconductor has a dielectric breakdown field strength about 10 times higher than that of silicon (Si). For this reason, the wide-gap semiconductors are expected as materials of a power semiconductor device that achieves a high breakdown voltage and low loss and thus outperforms a silicon device. For example, a Schottky barrier diode (SBD) containing SiC has been developed as a power semiconductor device that has a higher switching speed than that of an Si—PiN diode and implements a smaller low-loss power converter.

The SBD has problems of, for example, a large reverse leakage current and a low forward surge current withstand. To the contrary, a JBS diode (Junction Barrier Schottky Diode) and an MPS diode (Merged PiN Schottky Diode), which have both a Schottky junction and a p-n junction, are preferable for reducing the reverse leakage current and improving the surge current withstand.

However, when a wide-gap semiconductor is used, it is difficult to form an ohmic contact with a low resistance in a p-type semiconductor. Hence, the JBS or MPS structure cannot sufficiently improve the surge current withstand. Additionally, in this case, since the resistance of the p-n junction region is high, the forward current can hardly flow in the Schottky junction region.

It is therefore necessary to develop an SBD that is made of a wide-gap semiconductor and can implement a higher surge current withstand and a higher forward current density.

BRIEF DESCRIPTION OF THE DRAWINGS

FIGS. 2 to 7 are sectional views showing a method of manufacturing the semiconductor device shown in FIGS. 1A, 1B, and 1C;

FIG. 9 is a plan view showing a semiconductor device according to a comparative example.

DETAILED DESCRIPTION

Figure 1A:
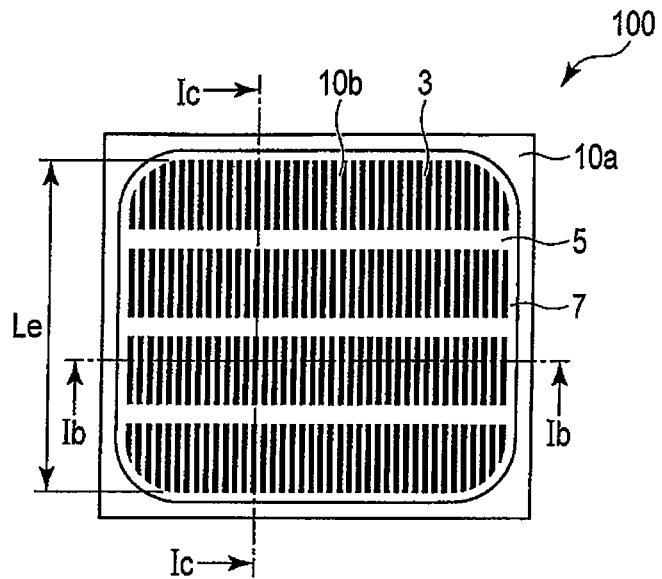
FIG. 1A is a plan view showing a semiconductor device according to the embodiment.

In general, according to one embodiment, a semiconductor device comprising: a semiconductor layer of a first conductivity type; a first region of a second conductivity type selectively provided in a first major surface of the semiconductor layer; a second region of the second conductivity type selectively provided in the first major surface and connected to the first region; a first electrode provided in contact with the semiconductor layer and the first region; a second electrode provided in contact with the second region; and a third electrode electrically connected to a second major surface of the semiconductor layer opposite to the first major surface.

An embodiment of the present invention will now be described with reference to the accompanying drawings. The same reference numerals denote the same parts throughout the drawings. A detailed description of the same parts will be omitted as needed, and different parts will be explained as needed. Note that in the embodiment to be described below, the first conductivity type is an n type, and the second conductivity type is a p type. However, the first conductivity type may be a p type, and the second conductivity type may be an n type.

Figure 1B:
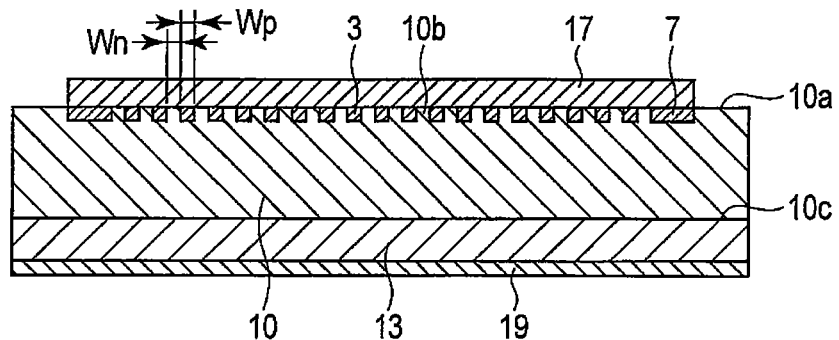
FIG. 1B is a sectional view taken along a line Ib-Ib in FIG. LA.
Figure 1C:
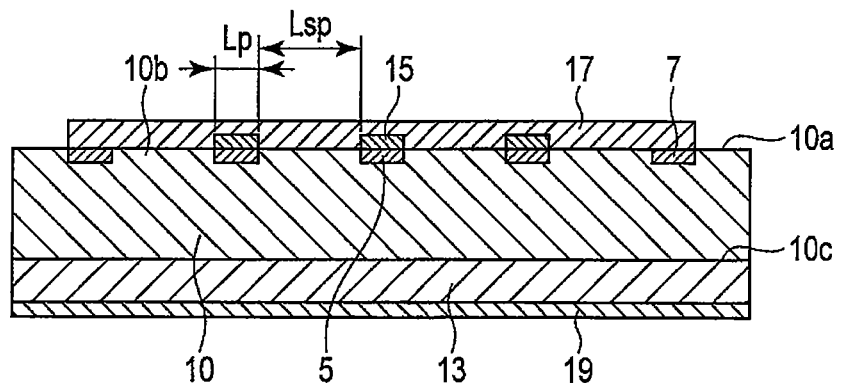
FIG. 1C is a sectional view taken along a line Ic-Ic in FIG. 1A.

FIGS. 1A, 1B, and 1C are views showing a semiconductor device 100 according to the embodiment.

The semiconductor device 100 is, for example, an SBD made of SiC. FIG. 1A schematically shows the layout in the chip surface of the SBD except an anode electrode 17. FIG. 1B is a sectional view taken along a line Ib-Ib in FIG. 1A. FIG. 1C is a sectional view taken along a line Ic-Ic in FIG. 1A.

As shown in FIG. 1A, the semiconductor device 100 comprises first p-type regions (first regions) 3 selectively provided in a first major surface 10a of an n-type SiC layer (semiconductor layer of the first conductivity type) 10 that is an n-type semiconductor layer, and second p-type regions (second regions) 5 selectively provided and connected to the first p-type regions 3.

The first p-type regions 3 are formed into a plurality of stripes extending in the first direction in the first major surface 10a. The first direction is the vertical direction in FIG. 1A. The second p-type regions 5 extend in the second direction perpendicular to the first direction. For example, the second p-type regions 5 are formed into stripes extending in the horizontal direction, as shown in FIG. 1A.

A third p-type region 7 is provided to surround the p-type regions 3 and 5. The p-type region 7 is provided along the boundary between an active region including the p-type regions 3 and 5 and a termination region outside the active region. The p-type region 7 functions as an edge termination for suppressing an edge breakdown that occurs at the edge of the active region. The p-type region 7 will be referred to as an edge termination 7 hereinafter.

As shown in FIG. 1B, the n-type SiC layer 10 is provided in, for example, an n-type SiC substrate 13. The p-type regions 3 and the edge termination 7 are provided in the first major surface 10a of the n-type SiC layer 10. N-type regions 10b are provided, which are parts of the n-type SiC layer 10 defined by the adjacent p-type regions 3.

The semiconductor device 100 further comprises the anode electrode 17 serving as a first electrode and provided in contact with the p-type regions 3 and the n-type regions 10b. The anode electrode 17 is provided also in contact with the surface of the edge termination 7.

The semiconductor device 100 also comprises an ohmic electrode 15 serving as a second electrode and provided in the surface of each p-type region 5 formed in the surface of the n-type SiC layer 10, as shown in FIG. 1C. As shown in FIG. 1C, the anode electrode 17 covers the ohmic electrodes 15.

The semiconductor device 100 further comprises a cathode electrode 19 serving as a third electrode and provided in a second major surface 10c opposite to the first major surface 10a of the n-type SiC layer 10. The cathode electrode 19 is, for example, provided in the lower surface of the n-type SiC substrate 13 and electrically connected to the second major surface 10c.

The semiconductor device 100 according to this embodiment comprises the anode electrode 17 that are in Schottky contact with the n-type SiC layer 10, and the ohmic electrodes 15 that are in ohmic contact with the p-type regions 5. The anode electrode 17 is also in contact with the surfaces of the p-type regions 3. Since an ohmic contact with p-type SiC is difficult to form, a Schottky contact is often formed between the anode electrode 17 and the p-type regions 3 having no ohmic electrodes 15.

A method of manufacturing the semiconductor device 100 will be described next with reference to FIGS. 2, 3, 4, 5, 6, and 7.

Figure 6:
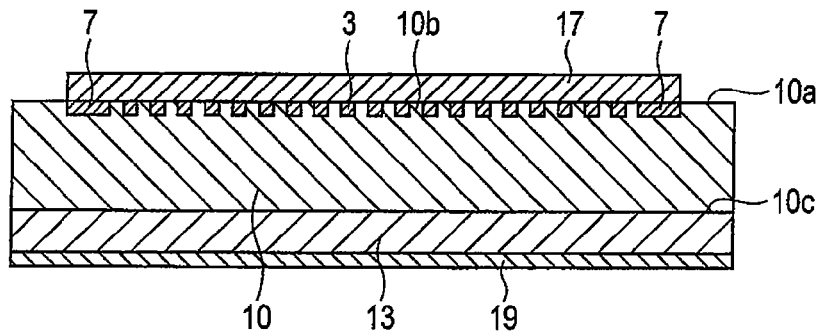
Figure 7:
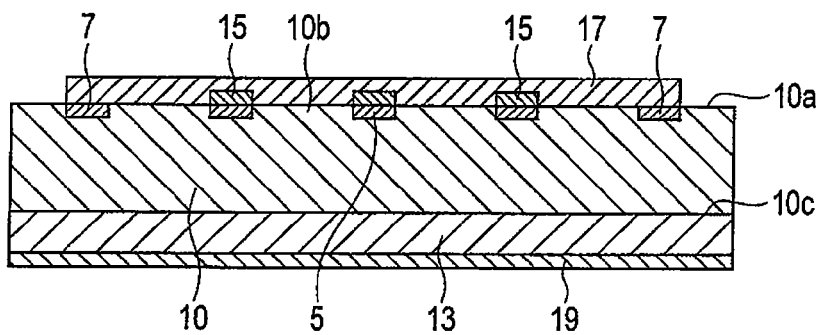

FIGS. 2, 3, 4, 5, 6, and 7 are schematic views showing a partial section of a wafer in the respective steps. FIGS. 2, 4, and 6 correspond to the sectional view taken along the line Ib-Ib in FIG. 1A. FIGS. 3, 5, and 7 correspond to the sectional view taken along the line Ic-Ic in FIG. LA.

FIGS. 2 and 3 illustrate a state in which aluminum (Al) that is a p-type impurity is ion-implanted into the first major surface 10a of the n-type SiC layer 10. An implantation mask 21 made of, for example, a resist is formed in the first major surface 10a. The implantation mask 21 has openings 21a, 21b, and 21c.

As shown in FIG. 2, Al is selectively implanted through the stripe-shaped openings 21a to form the p-type regions 3. At the same time, Al is selectively implanted through the opening 21c to form the edge termination 7. In addition, Al is selectively implanted through the openings 21b shown in FIG. 3 to form the p-type regions 5. The implantation amount (dose) of Al is set such that the peak concentration of Al becomes $2 \times 10^{18}$ cm$^{-3}$.

Subsequently, the implantation mask 21 is removed by, for example, a wet process, and annealing is performed. The annealing is done at, for example, 1,500° C. or more to activate the ion-implanted Al. With this process, the p-type regions 3 and 5 and the edge termination 7 are formed in the surface of the n-type SiC layer 10.

Next, the ohmic electrodes 15 in contact with the p-type regions 5 are formed. For example, a nickel (Ni) film is formed by, for example, vacuum deposition as the prospective ohmic electrode 15. Then, patterning is performed such that the Ni film is removed in the p-type regions 3 and the n-type regions 10b and left in the p-type regions 5, as shown in FIGS. 4 and 5.

Then, annealing is performed at, for example, 500° C. to 700° C. The ohmic electrodes 15 are thus formed in the p-type regions 5. In this embodiment, the Ni film on the edge termination 7 is removed. However, the ohmic electrodes 15 may be formed while leaving the Ni film on the edge termination 7.

Next, the anode electrode 17 is formed in the first major surface 10a of the n-type SiC layer 10, and the cathode electrode 19 is formed in the second major surface 10c, as shown in FIGS. 6 and 7.

As the anode electrode 17, for example, a stacked film of titanium (Ti) and Al formed by sputtering is used. In this case, the Ti film is in contact with the surfaces of the p-type regions 3 and the n-type regions 10b. The anode electrode 17 is formed in contact with the surfaces of the p-type regions 3, the n-type regions 10b, and the edge termination 7 and covers the ohmic electrodes 15. On the other hand, as the cathode electrode 19, for example, an Ni film formed by vacuum deposition is usable.

In the above-described manufacturing method, the Al ion-implanted into the n-type SiC layer 10 does not diffuse upon annealing. Hence, the p-type regions 3 and 5 and the edge termination 7 are formed into the same sizes as those of the openings 21a, 21b, and 21c, respectively.

In the second direction perpendicular to the first direction that is the stripe extending direction, the opening 21a is preferably formed to a width of 0.5 µm (inclusive) to 5 µm (inclusive). A width Wn of the n-type region 10b between the adjacent p-type regions 3 is preferably set to 1 µm (inclusive) to 5 µm (inclusive).

For example, the smaller the width Wn of the n-type region 10b is, the less the reverse leakage current and the field strength of the Schottky junction between the anode electrode 17 and the n-type regions 10b are.

However, if the width Wn of the n-type region 10b is too small, a depletion layer spreads from the p-type regions 3 on both sides of the n-type region 10b due to a built-in voltage, and the neutral region in the n-type region 10b becomes considerably narrow. For this reason, the forward resistance rises, and the Schottky current flowing from the anode electrode 17 to the n-type SiC layer 10 decreases, resulting in a smaller current capacity.

The width of the depletion layer spreading from the p-type regions 3 to the n-type region 10b is, for example, about 0.3 µm. Hence, the width Wn is preferably at least 1 µm.

On the other hand, when the width Wn of the n-type region 10b increases, the reverse leakage current increases. When the width Wn is, for example, about 5 µm, a width Ws of a region where the field strength at the time of reverse bias application almost equals that in the p-type regions 3 is about 2 µm. That is, letting Wd be the width of the depletion layer spreading from the p-type regions 3 to the n-type region 10b, Ws is given by $$Ws = Wn - 2Wd \quad (1)$$

The ratio of the leakage current flowing to the Schottky junction and the leakage current flowing to the p-n junction through the p-type regions 3 is given by $$r \approx s/(Wn + Wp) \quad (2)$$

For example, when Ws is 2 µm, Wn is 5 µm, and Wp<Wn, $$0.2 < r < 0.4$$

The reason why Wp<Wn will be described later.

The leakage current of the Schottky junction or p-n junction includes a variation of about one order of magnitude. Hence, when r is 0.2 to 0.4, the reverse leakage current decreasing effect obtained by providing the p-type regions 3 is not so large. That is, the leakage current is preferably decreased by making the width Wn smaller than 5 µm. Hence, the width Wn preferably ranges from about 1 to 5 µm.

This allows to deplete the n-type region 10b and reduce the leakage current in the Schottky junction between the anode electrode 17 and the n-type region 10b upon reverse bias application between the anode and cathode.

On the other hand, the width Wp of the p-type region 3 is equal to or smaller than the width Wn of the n-type region 10b. For example, when the width Wn has a predetermined value, the number of n-type regions 10b can be increased by making the width Wp of the p-type region 3 smaller. This enables to increase the Schottky junction area and the forward Schottky current.

However, when the width Wp is smaller than 0.3 µm, the radius of curvature of the bottom portion of the p-type region 3 decreases. At this time, when the reverse bias is applied, the field strength increases in the bottom portion of the p-type region 3, resulting in a breakdown. Hence, the width Wp is preferably 0.5 µm or more.

To increase the forward Schottky current, the width Wp is preferably 0.5 µm. However, the width Wp is preferably large to some degree in consideration of the variation in the manufacturing method. This makes it possible to suppress the variation in the forward and reverse current-voltage characteristic and prevent a decrease in the manufacturing yield.

For example, when the ratio of the n-type region area to the whole electrode area is ½ or less, the decrease in the Schottky current is conspicuous. Hence, $$½ \leq Wn/(Wn+Wp) \quad (3)$$

is preferably satisfied.

That is, Wp≤Wn, and the width Wp preferably ranges from 0.5 µm to Wn. For example, when Wn=3 µm, the appropriate value of Wp is 0.5 to 3 µm.

The width of the opening 21b perpendicular to the extending direction preferably ranges from 10 µm to 500 µm. That is, a width Lp of the p-type region 5 is made larger than the width of the p-type region 3 by two orders of magnitude. This allows to reduce the density of the forward current flowing through the p-type regions 5 where the ohmic electrodes 15 are formed and improve the surge current withstand. In addition, the plurality of p-type regions 5 can be formed.

For example, if the width Lp of the p-type region 5 is smaller than 10 µm, the Schottky current sneaks under the p-type region 5 not to apply the forward bias to the p-n junction between the p-type region 5 and the n-type SiC layer 10, and no forward current flows through the p-n junction upon forward bias application.

On the other hand, when the width Lp is large, the forward current readily flows through the p-n junction, and the surge current withstand is improved. However, since the area of the n-type regions 10b relatively decreases, the forward Schottky current decreases, and the switching speed in the normal operation lowers.

For this reason, the area of the p-type regions 5 is preferably 20% or less the area of the anode electrode 17. That is, the width Lp is preferably determined to satisfy $$N \times Lp \leq 0.2 \times Le \quad (4)$$

where N is the number of p-type regions 5, and Le is the width of the anode electrode in the extending direction of the p-type regions 3 (see FIGS. 1A, 1B, and 1C).

For example, when Le=5 mm, and N=4, the width Lp appropriately ranges from 10 to 250 µm. For example, as shown in FIG. 1A, the three p-type regions 5 can be arranged in the vertical direction, and the interval between them can be set within the range of 600 to 6,000 µm.

The interval between the adjacent p-type regions 5 is set within the range in which the p-type regions 3 are maintained at the equipotential to the Schottky junction so as not to be in a floating state.

For example, if a ratio Lsp/Wp of an interval Lsp between the adjacent p-type regions 5 to the width Wp of the p-type region 3 is too large, the p-type regions 3 spaced apart from the p-type regions 5 are not maintained at the equipotential to the Schottky junction. In addition, assume that the forward current flowing to one stripe of the p-type regions 3 is 1 µA or less in a state in which a voltage of 2 V is applied to the Schottky junction. In this case, to maintain the p-type regions 3 and the Schottky junction at the equipotential, a resistance R of the stripe of the p-type regions 3 need only satisfy $$R < 3V/1 \mu A = 3 \times 10^6 \Omega$$

Since the sheet resistance of the p-type regions 3 is about 10 to 100 kΩ/□, Lsp/Wp need only be about 300 to 3,000. For example, when the width Wp is 2 µm, the interval Lsp preferably ranges from about 600 to 6,000 µm.

The width of the opening 21c is, for example, 50 µm. The edge termination 7 having a width of 50 µm is thus formed along the active region.

Figure 8:
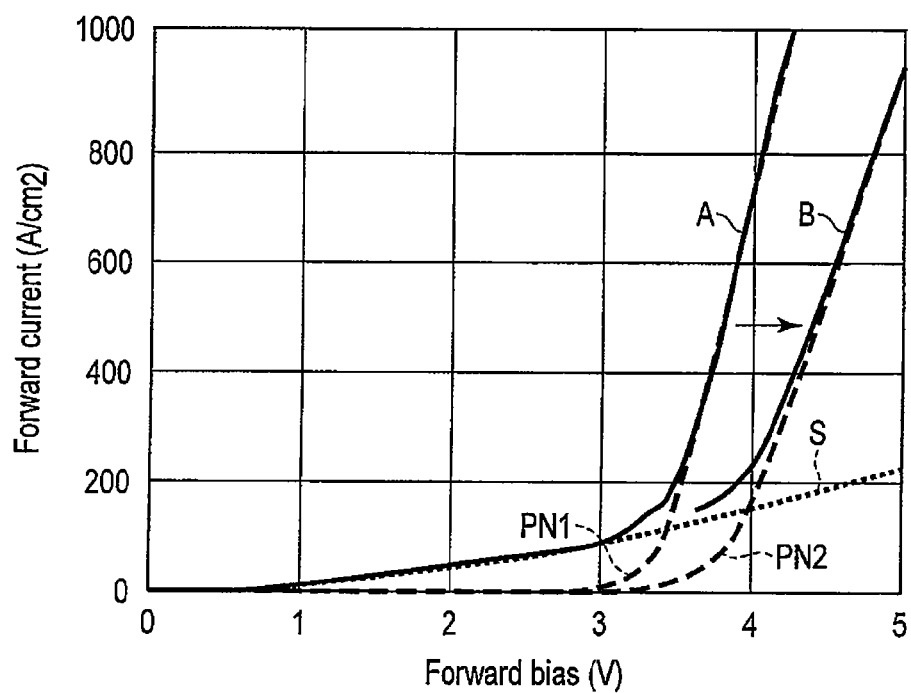
FIG. 8 is a graph showing the forward characteristic of the semiconductor device according to the embodiment.

FIG. 8 is a graph showing the forward characteristic of the semiconductor device 100.

Referring to FIG. 8, the abscissa represents the forward bias, and the ordinate represents the forward current. Solid lines A and B in FIG. 8 represent the forward current characteristics of the p-type regions 5 having different areas, respectively.

Broken lines PN1 and PN2 in FIG. 8 represent the forward currents flowing through the p-n junctions of the p-type regions 3 and 5, respectively. On the other hand, a dotted line S represents the forward current flowing through the Schottky junction between the n-type regions 10b and the anode electrode 17. The sum of the forward current represented by the broken line PN1 and that represented by the dotted line S corresponds to the forward characteristic represented by the solid line A.

The forward characteristic represented by the solid line A indicates that the current flowing through the Schottky junction is dominant until the forward bias reaches the built-in voltage (about 3 V) of the p-n junction formed between the p-type regions 3 and 5 and the n-type SiC layer 10. When the forward bias exceeds the built-in voltage, the current flowing through the p-n junction becomes dominant.

When the ohmic electrodes 15 are formed in the surfaces of the p-type regions, the forward resistance of the p-n junction lowers to suppress heat generation. This improves the forward current withstand and allows to increase the surge current withstand.

The solid line B represents the forward characteristic when the p-type regions 5 have an area smaller than that in the case of the solid line A. When the area of the p-type regions 5 is smaller, the resistance to the forward current flowing through the p-n junction rises. For this reason, as indicated by the broken line PN2, the forward current flowing through the p-n junction decreases and shifts to the higher bias side than the forward current represented by the broken line PN1.

As a result, the forward characteristic represented by the solid line B, which is the sum of the forward current represented by the broken line PN2 and that represented by the dotted line S, shifts to the higher bias side than the forward characteristic represented by the solid line A.

This allows to widen the range of the forward bias in which the current flowing through the Schottky junction is dominant to the higher voltage side. That is, appropriately setting the area of the p-type regions 5 makes it possible to improve the surge current withstand and appropriately ensure the range of the bias voltage having the high-speed switching property.

The area of the p-type regions can be adjusted by, for example, the width Lp of the p-type regions 5 shown in FIG. 1A or the number N of the p-type regions 5 arranged.

Additionally, in the semiconductor device 100, the density of the forward current flowing through the Schottky junction can be made higher than in a semiconductor device 200 shown in FIG. 9.

For example, in the semiconductor device 200, neither the p-type regions 5 nor the ohmic electrodes 15 are formed, as shown in FIG. 9. In addition, a Schottky junction or a high contact resistance exists between the p-type regions 3 and the anode electrode 17.

For this reason, when a forward bias is applied to the semiconductor device 200, a potential difference is generated between the p-type regions 3 and the anode electrode 17. The p-type regions 3 are set in the floating state because their potential takes an intermediate value between the anode electrode and the cathode electrode.

When the potential difference generated between the p-type regions 3 and the anode electrode 17 at the time of forward bias application is large, the voltage applied to the p-n junction between the p-type regions 3 and the n-type SiC layer 10 becomes low. Hence, the depletion regions that spread to the n-type regions 10b due to the built-in voltage of the p-n junction are not reduced, and the forward current is hard to flow.

To the contrary, in the semiconductor device 100 in which the ohmic electrodes 15 are provided between the anode electrode 17 and the p-type regions 5, the anode electrode 17 and the p-type regions 5 have the equipotential, and the potential difference between the anode electrode 17 and the p-type regions 3 connected to the p-type regions 5 can be made smaller. It is therefore possible to reduce the depletion regions spreading to the n-type regions 10b and improve the density of the forward current flowing through the Schottky junction.

For example, the semiconductor devices 100 and 200 were experimentally manufactured while setting the chip size to 450 μm×450 μm, the width of the p-type region 3 to 2 μm, and the interval between the adjacent p-type regions 3 to 3 μm. For the semiconductor device 100, the width of the p-type region 5 was set to 50 μm, and the interval between the three p-type regions 5 was set to 1 mm.

The current density for a forward bias of 2 V was 1.1 times higher in the semiconductor device 100 than in the semiconductor device 200. In addition, the forward surge current withstand was two or more times higher in the semiconductor device 100 than in the semiconductor device 200.

As described above, the semiconductor device 100 according to the embodiment comprises the p-type regions 3, the p-type regions 5 connected to the p-type regions 3, and the ohmic electrodes 15 in contact with the p-type regions 5. This enables to improve the forward surge current withstand and raise the density of the forward current flowing through the Schottky junction.

In the above-described embodiment, the p-type regions 3 are formed into stripes, and the p-type regions 5 are perpendicular to the stripes. However, the structure is not limited to this and may be different from that of the embodiment. In the above-described example, SiC is used as the semiconductor material. However, another wide-gap semiconductor such as a GaN-based nitride semiconductor may be used.

In this specification, "nitride semiconductors" include III-V group compound semiconductors represented by $B_xIn_yAl_zGa_{1-x-y-z}N$ ($0 \leq x \leq 1$, $0 \leq y \leq 1$, $0 \leq z \leq 1$, $0 \leq x+y+z \leq 1$). As the V group elements, mixed crystals containing phosphorus (P), arsenic (As), or the like in addition to N (nitrogen) are also included. The "nitride semiconductors" also include materials containing various elements added to control various physical properties such as the conductivity type and materials further containing various elements unintentionally.

According to the embodiment, it is possible to implement a semiconductor device capable of raising the surge current withstand and improving the forward current density.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer of a first conductivity type;
   a first region of a second conductivity type selectively provided in a first major surface of the semiconductor layer, the first region comprising a plurality of column regions spaced from each other in a first direction along the first major surface, each of the column regions including a plurality of first stripe regions extending in the first direction, the first stripe regions of each column region being spaced from each other in a second direction along the first major surface perpendicular to the first direction;
   a second region of the second conductivity type selectively provided in the first major surface, the second region including a plurality of second stripe regions extending in the second direction, at least one of the second stripe regions being provided between adjacent column regions, an end, in the first direction, of each of the first stripe regions meeting the second region;
   a third region of the second conductivity type surrounding the first and second regions in a plane of the first major surface, both ends, in the second direction, of each of the second stripe regions meeting the third region;
   a first electrode provided in contact with the semiconductor layer and the first region, the first electrode being in Schottky contact with the semiconductor layer;
   a second electrode provided ohmic in contact with the second region; and
   a third electrode electrically connected to a second major surface of the semiconductor layer opposite to the first major surface.

2. The device of claim 1, wherein a space between the plurality of first stripe regions adjacent in the second direction ranges from 1 μm (inclusive) to 5 μm (inclusive), and each first stripe region is not wider than the space and has a width of not less than 0.5 μm in the second direction.

3. The device of claim 1, wherein a space between the plurality of second stripe regions adjacent in the first direction ranges from 300×Wp (inclusive) to 3,000×Wp (inclusive), and a width of each second stripe region in the first direction ranges from 10 μm (inclusive) to (0.2×Le)/N,
   where Le is a width of the first electrode in the first direction, N is the number of second stripe regions in the plurality of second stripe regions, and Wp is the width of each first stripe region in the second direction.

4. The device of claim 1, wherein the semiconductor layer includes at least one of SiC and GaN.

5. The device of claim 1, wherein the first electrode is provided in contact with the third region.

6. The device of claim 1, wherein the second electrode is between a portion of the first electrode and the semiconductor layer.

7. A Schottky diode, comprising:
   a semiconductor layer of a first conductivity type comprising a wide-gap semiconductor;
   a first region of a second conductivity type selectively provided in a first major surface of the semiconductor layer, the first region comprising column regions spaced from each other in a first direction along the first major surface, each of the column regions including first stripe regions extending in the first direction and spaced from each other a second direction along the first major surface that is perpendicular to the first direction;

a second region of the second conductivity type selectively provided in the first major surface, the second region including second stripe regions extending in the second direction and spaced from each other in the first direction, the second stripe regions provided between the column regions, at least one end, in the first direction, of each of the first stripe regions meeting the second region;

a third region of the second conductivity type surrounding the first and second regions in a plane of the first major surface, both ends, in the second direction, of the second stripe regions meeting the third region;

a first electrode provided in contact with the semiconductor layer and the first region, the first electrode being in Schottky contact with the semiconductor layer;

a second electrode provided in ohmic contact with the second region; and a third electrode electrically connected to a second major surface of the semiconductor layer opposite to the first major surface.

8. The Schottky diode of claim 7, wherein a space between the first stripe regions adjacent in the second direction ranges from 1 µm (inclusive) to 5 µm (inclusive), and each first stripe region is not wider than the space and has a width of not less than 0.5 µm in the second direction.

9. The Schottky diode of claim 7, wherein a space between the plurality of second stripe regions adjacent in the first direction ranges from 300×Wp (inclusive) to 3,000×Wp (inclusive), and a width of each second stripe region in the first direction ranges from 10 µm (inclusive) to (0.2×Le)/N, where Le is a width of the first electrode in the first direction, N is the number of second stripe regions, and Wp is the width of each first stripe region in the second direction.

10. The Schottky diode of claim 7, wherein the semiconductor layer includes at least one of SiC and GaN.

11. The Schottky diode of claim 7, wherein the first electrode is provided in contact with the third region.

12. The Schottky diode of claim 7, wherein the second electrode is between a portion of the first electrode and the semiconductor layer.

\* \* \* \* \*